United States Patent
Dennison

(10) Patent No.: US 7,005,666 B2
(45) Date of Patent: Feb. 28, 2006

(54) METHOD TO SELECTIVELY INCREASE THE TOP RESISTANCE OF THE LOWER PROGRAMMING ELECTRODE IN A PHASE-CHANGE MEMORY CELL AND STRUCTURES OBTAINED THEREBY

(75) Inventor: Charles Dennison, San Jose, CA (US)

(73) Assignee: Ovonyx, Inc., Boise, ID (US)

( * ) Notice: Subject to any disclaimer, the term of this patent is extended or adjusted under 35 U.S.C. 154(b) by 133 days.

(21) Appl. No.: 10/679,637

(22) Filed: Oct. 6, 2003

(65) Prior Publication Data

US 2004/0067608 A1 Apr. 8, 2004

Related U.S. Application Data

(62) Division of application No. 09/737,363, filed on Dec. 14, 2000, now Pat. No. 6,696,355.

(51) Int. Cl.
*H01L 47/00* (2006.01)
(52) U.S. Cl. .................................. 257/4; 257/2; 257/5
(58) Field of Classification Search .................... 257/2, 257/3, 4, 5, 529, 530
See application file for complete search history.

(56) References Cited

U.S. PATENT DOCUMENTS

2002/0045323 A1 * 4/2002 Lowrey et al. ............. 438/382

OTHER PUBLICATIONS

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS-Compatible Phase-Change Nonvolatile RAM Using NMOS Cell Transistors," presented at 2003 19th IEEE Non-Volatile Semiconductor Memory Workshop, Monterey, California, Feb. 26-20, 2003.

Ha, Y.H., Yi, J.H., Horii, H., Park, J.H., Joo, S.H., Park, S.O., Chung, U-In and Moon, J.T., "An Edge Contact Type Cell for Phase Change RAM Featuring Very Low Power Consumption," presented at IEEE 2003 Symposium on VLSI Technology, Kyoto, Japan, Jun. 12-14, 2003.

Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase-change RAM Based on 0.24 mm-CMOS Technologies," presented at IEEE 2003 Symposium on VLSI Technology, Kyoto, Japan, Jun. 12-14, 2003.

(Continued)

*Primary Examiner*—Kevin M. Picardat
(74) *Attorney, Agent, or Firm*—Trop, Pruner & Hu, P.C.

(57) ABSTRACT

The present invention relates to a process of forming a phase-change memory. A lower electrode is disposed in a first dielectric film. The lower electrode comprises an upper section and a lower section. The upper section extends beyond the first dielectric film. Resistivity in the upper section is higher than in the lower section. A second dielectric film is disposed over the first dielectric film and has an upper surface that is coplanar with the upper section at an upper surface.

18 Claims, 18 Drawing Sheets

OTHER PUBLICATIONS

Horii, H., Yi, J.H., Park, J.H., Ha, Y.H., Baek, I.G., Park, S.O., Hwang, Y.N., Lee, S.H., Kim, Y.T., Lee, K.H., Chung, U-In and Moon, J.T., "A Novel Cell Technology Using N-doped GeSbTe Films for Phase Change RAM," presented at IEEE 2003 Symposium on VLSI Technology, Kyoto, Japan, Jun. 12-14, 2003.

* cited by examiner

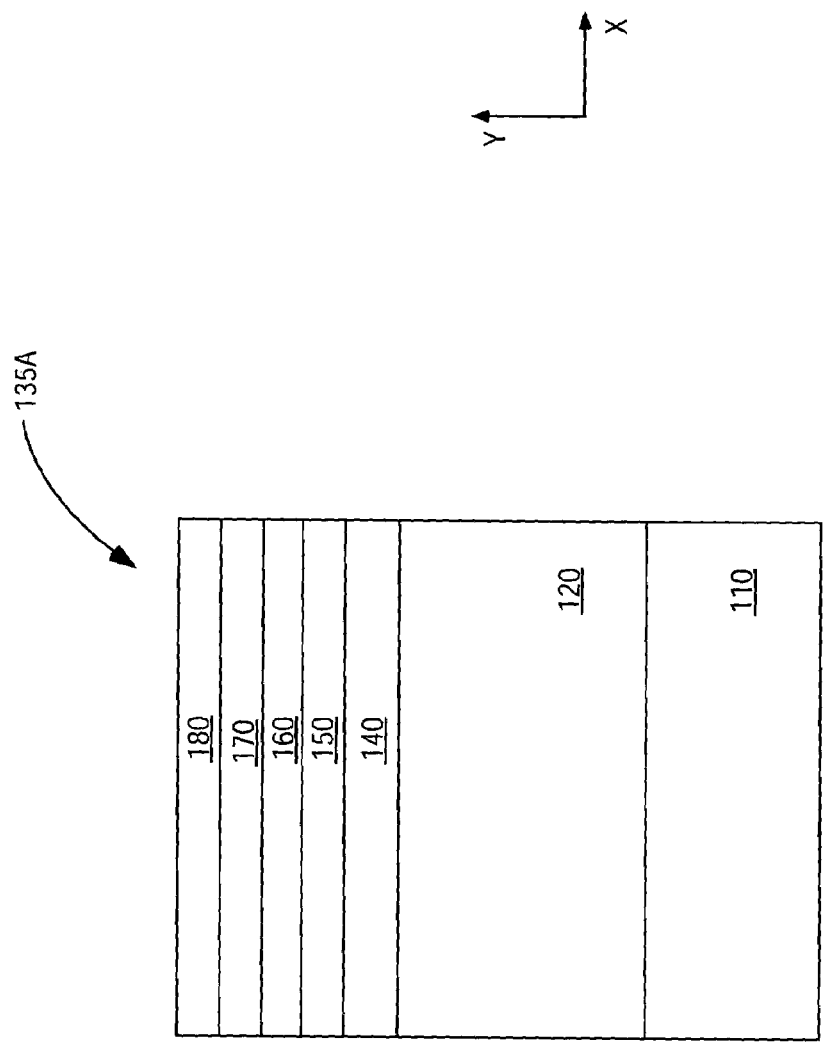

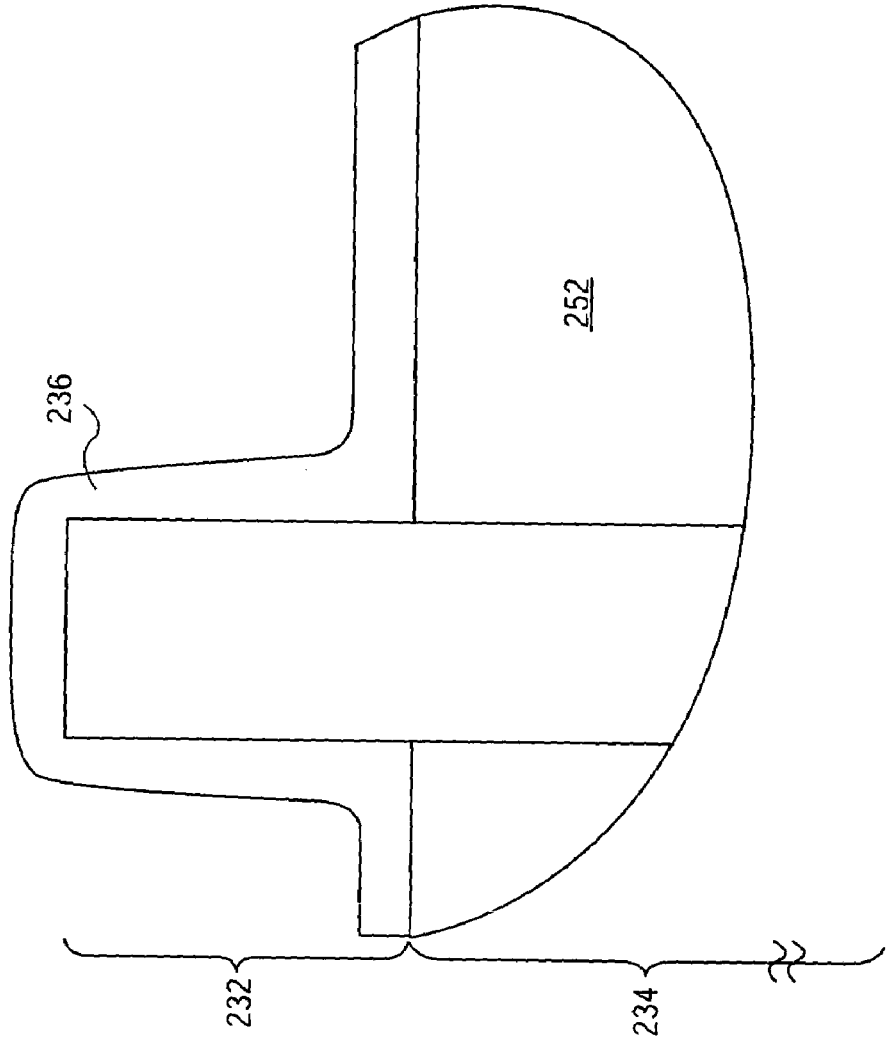

METHOD TO SELECTIVELY INCREASE THE TOP RESISTANCE OF THE LOWER PROGRAMMING ELECTRODE IN A PHASE-CHANGE MEMORY CELL AND STRUCTURES OBTAINED THEREBY

This application is a divisional of U.S. patent application Ser. No. 09/737,363 filed Dec. 14, 2000 now U.S. Pat. No. 6,696,355.

BACKGROUND OF THE INVENTION

1. Field of the Invention

The present invention relates to a phase-change memory device. More particularly, the present invention relates to a heater electrode in a chalcogenide memory cell. In particular, the present invention relates to a lower electrode with increased resistivity.

2. Description of Related Art

As microelectronic technology progresses, the need has arisen for new data retention schemes. One such data retention scheme is the chalcogenide phase-change technology. Typically, a phase-change memory device includes a polysilicon lower electrode, also known as a "matchstick".

After the formation of a recess in a substrate that exposes an active area, a conformal introduction of lower electrode material is required. Lower electrode material is typically polycrystalline silicon. The conformal introduction of lower electrode material that is polycrystalline silicon may follow conventional introduction techniques known to those skilled in the art including chemical vapor deposition (CVD) techniques. Thereafter, a dopant is introduced into the polycrystalline silicon to adjust the resistivity, in one aspect, to lower the resistivity of the material. A suitable dopant is a P-typed dopant such as boron introduced. From the combination of polysilicon and dopant, a silicidation process is required to form a silicide of the lower electrode. This process typically is a doping, a first anneal, a wet strip, and a second anneal.

After proper doping and fill into the trench, a planarization process is required to remove any horizontal component of the lower electrode. Thereafter, a modifier material must be introduced into a portion of the lower electrode material to combine and/or react with the lower electrode material near the top to form a different material. The modifier is introduced to raise the local resistance of the lower electrode material. By modifying a portion of the lower electrode material, the resistivity at that modified portion may be changed. Because the modifying material is of a higher resistivity, the lower electrode may not provide sufficiently suitable ohmic contact between the lower electrode and the volume of memory material for a desired application. In such cases, modifying material may be introduced into the lower electrode at a depth below the exposed surface of the lower electrode. For example, a lower electrode of polycrystalline silicon may have polycrystalline silicon at the exposed surface and a modifying material at a depth below the exposed surface. Additionally, barrier materials must be added to prevent cross-contamination between the chalcogenide material and the lower electrode. Typically, the formation of a barrier requires a nitridation process.

As low power set and reset processes are preferred, it is desirable to reduce the energy requirement for the lower electrode to program the phase-change memory device.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which:

FIG. 6 shows the cross-section of the structure of FIG. 4 through line B–B';

FIG. 12C illustrates upper section 232 after a deposition of a high resistivity film 244;

DETAILED DESCRIPTION OF THE INVENTION

The invention relates to a memory device that is used with phase-change material to memorialize data storage. The device uses a lower electrode material that is referred to as a "matchstick". The inventive process includes providing a lower electrode in a first dielectric film that has an upper section and a lower section. A portion of the first dielectric film is removed to cause the upper section to form a prominence. Thereafter, resistivity is increased in the upper section. A second dielectric film is formed over the upper section and either a spacer etch or a planarization is carried out to expose the upper section in a coplanar configuration with the second dielectric film. Thereafter, a volume of phase change memory material may be formed over the exposed portion of the upper section. Either a high resistivity metal compound may be used as the lower electrode, or a polysilicon compound may be used.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientation. Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 1:
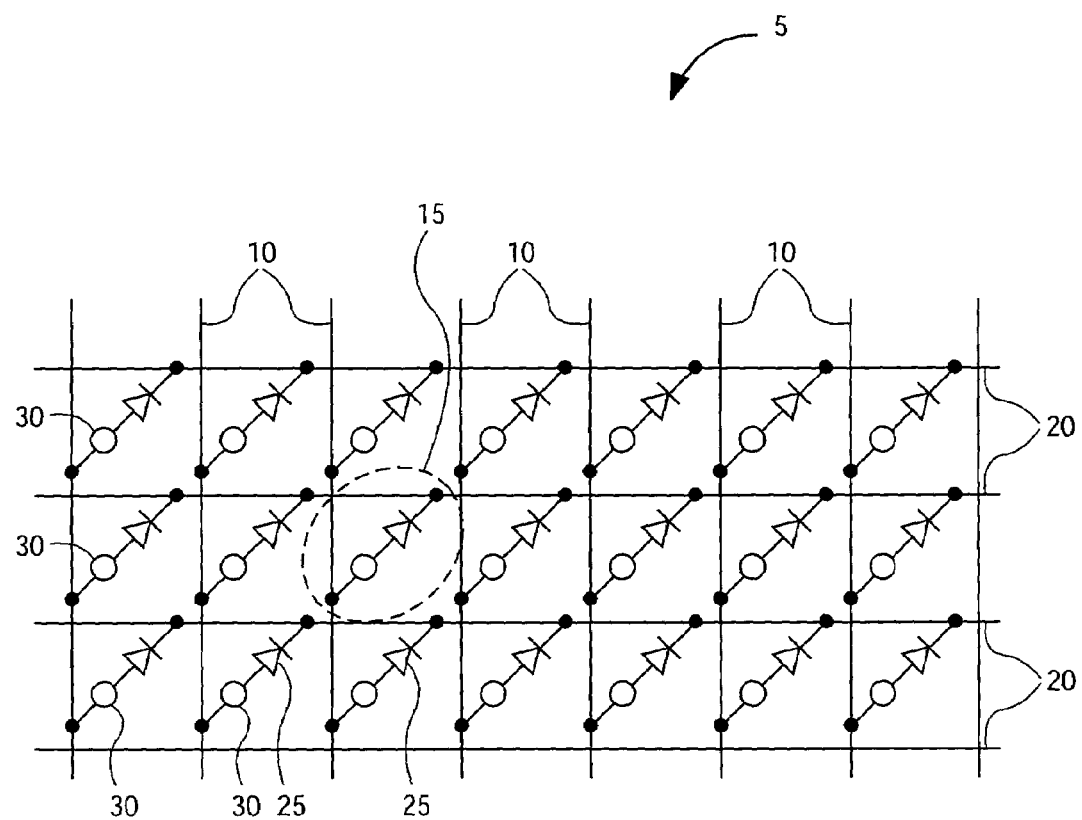
FIG. 1 is a schematic diagram of an array of memory elements according to an embodiment of the invention.

FIG. 1 shows a schematic diagram of an embodiment of a memory array comprised of a plurality of memory elements presented and formed in the context of the invention. In this example, the circuit of memory array 5 includes an array with memory element 30 electrically interconnected in series with isolation device 25 on a portion of a chip. Address lines 10 (e.g., columns) and 20 (e.g., rows) are connected, in one embodiment, to external addressing circuitry in a manner known to those skilled in the art. One purpose of the array of memory elements in combination with isolation devices is to enable each discrete memory element to be read and written without interfering with the information stored in adjacent or remote memory elements of the array.

A memory array such as memory array 5 may be formed in a portion, including the entire portion, of a substrate. A typical substrate includes a semiconductor substrate such as a silicon substrate. Other substrates including, but not limited to, substrates that contain ceramic material, organic material, or glass material as part of the infrastructure are also suitable. In the case of a silicon semiconductor substrate, memory array 5 may be fabricated over an area of the substrate at the wafer level and then the wafer may be reduced through singulation into discrete die or chips, some or all of the die or chips having a memory array formed thereon. Additional addressing circuitry such as sense amplifiers, decoders, etc. may be formed in a similar fashion as known to those of skill in the art.

Figure 2:
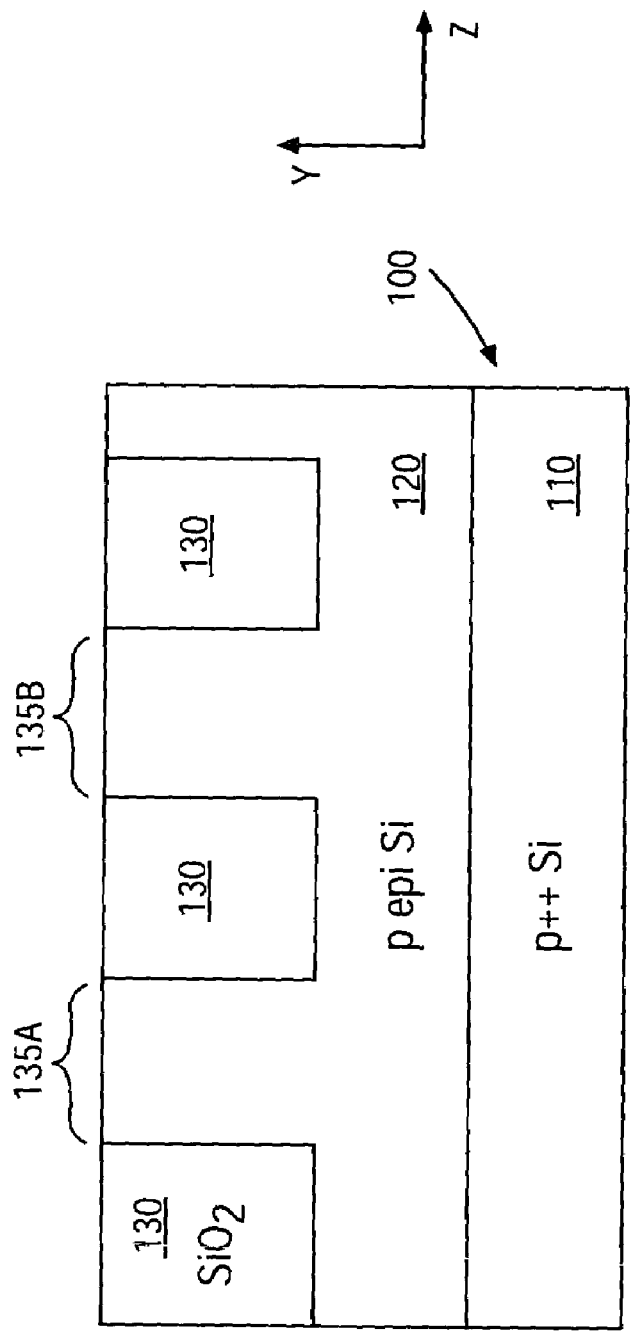
FIG. 2 schematically illustrates a cross-sectional planar side view of a portion of a semiconductor substrate having dielectric trenches formed therein defining a z-direction thickness of a memory cell in accordance with one embodiment of the invention of forming a memory element on a substrate.

FIGS. 2–15 illustrate the fabrication of representative memory element 15 of FIG. 1. FIG. 2 shows a portion of substrate 100 that is, for example, a semiconductor substrate. In this example, a P-type dopant such as boron is introduced in a deep portion 110. In one example, a suitable concentration of P-type dopant is on the order of above $5 \times 10^{19} - 1 \times 10^{20}$ atoms per cubic centimeters (atoms/cm$^3$) rendering deep portion 110 of substrate 100 representatively P$^{++}$. Overlying deep portion 110 of substrate 100, in this example, is an epitaxial portion 120 of P-type epitaxial silicon. In one example, the dopant concentration in epitaxial portion 120 is on the order of about $10^{16}-10^{17}$ atoms/cm$^3$. The introduction and formation of epitaxial portion 120 as P-type, and deep portion 110 may follow techniques known to those of skill in the art.

FIG. 2 also shows first shallow trench isolation (STI) structures 130 formed in epitaxial portion 120 of substrate 100. As will become apparent in the subsequent discussion, STI structures 130 serve, in one aspect, to define the z-direction thickness of a memory element cell, with at this point only the z-direction thickness of a memory element cell defined. In another aspect, STI structures 130 serve to isolate individual memory elements from one another as well as associated circuit elements such as transistor devices formed in and on substrate 100. STI structures 130 are formed according to techniques known to those skilled in the art.

Figure 3:
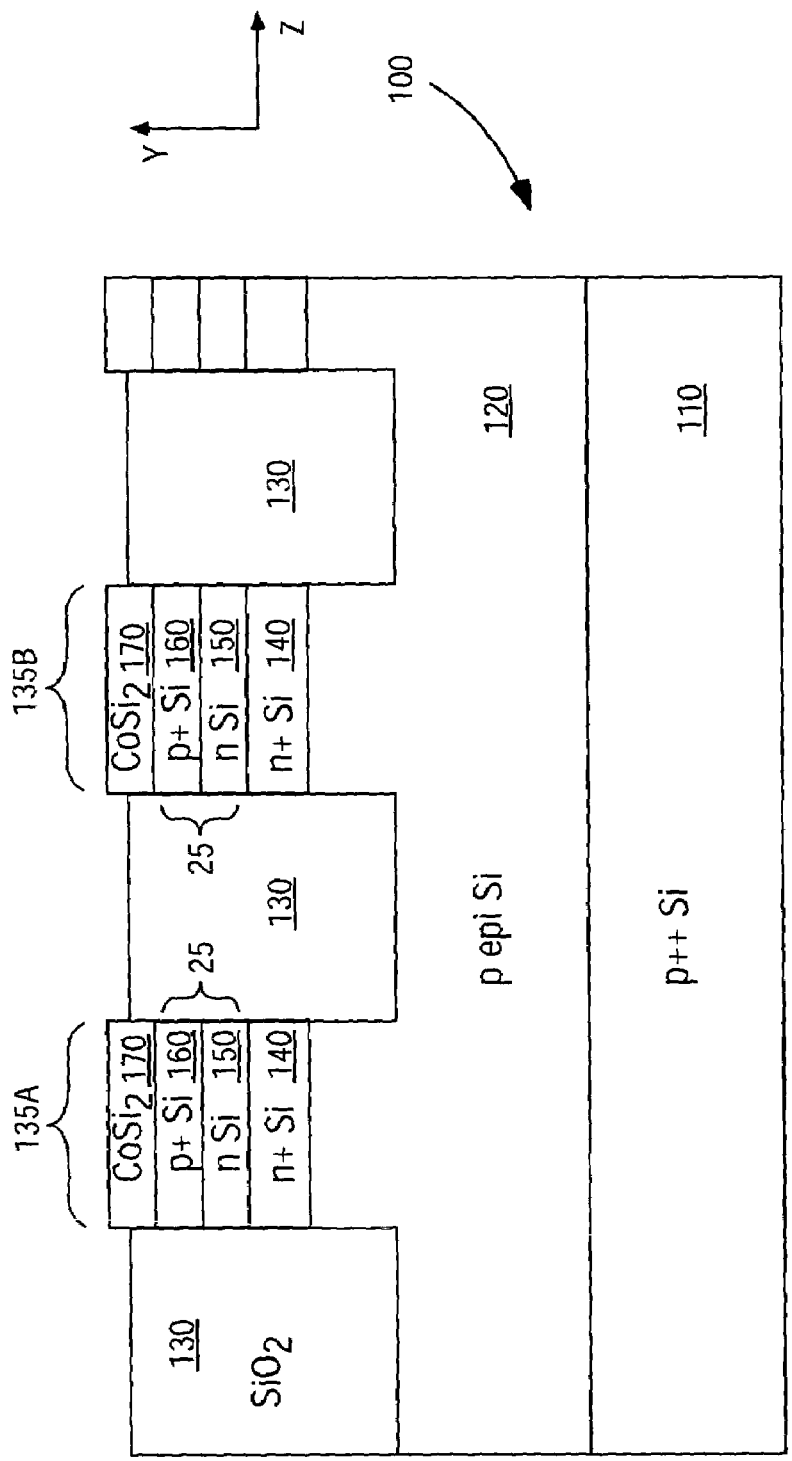
FIG. 3 shows the structure of FIG. 2, through the same cross-sectional view, after the introduction of dopants to form an isolation device for a memory element in accordance with one embodiment of the invention.

FIG. 3 shows the structure of FIG. 2 after a further fabrication operation in memory cell regions 135A and 135B. In one embodiment, memory cell regions 135A and 135B are introduced as strips with the x-direction dimension greater than the z-direction dimension. Overlying epitaxial portion 120 of substrate 100 is first conductor or signal line material 140. In one example, first conductor or signal line material 140 is N-type doped silicon formed by the introduction of, for example, phosphorous or arsenic to a concentration on the order of about $10^{18}-10^{19}$ atoms/cm$^3$ such as N$^+$ silicon. In this example, first conductor or signal line material 140 serves as an address line, a row line such as row line 20 of FIG. 1. Overlying first conductor or signal line material 140 is an isolation device such as isolation device 25 of FIG. 1. In one example, isolation device 25 is a PN diode formed of N-type silicon portion 150 that may have a dopant concentration on the order of about $10^{17}-10^{18}$ atoms/cm$^3$ and P-type silicon portion 160 that may have a dopant concentration on the order of about $10^{19}-10^{20}$ atoms/cm$^3$. Although a PN diode is shown, it is to be appreciated that other isolation structures are similarly suitable. Such isolation devices include, but are not limited to, MOS devices.

Referring to FIG. 3, overlying isolation device 25 in memory cell regions 135A and 135B is a reducer material 170 of, in this example, a refractory metal silicide such as cobalt silicide (CoSi$_2$). Reducer material 170, in one aspect, serves as a low resistance material in the fabrication of peripheral circuitry such as addressing circuitry of the circuit structure on the chip. Thus, reducer material 170 may not be required in terms of forming a memory element as described. Nevertheless, because of its low resistance property, its inclusion as part of the memory cell structure between isolation device 25 and memory element 30 is utilized in this embodiment. Additionally, because of its etch stop property, additional lithography processes are not required to mask it off from the memory cells.

Figure 4:
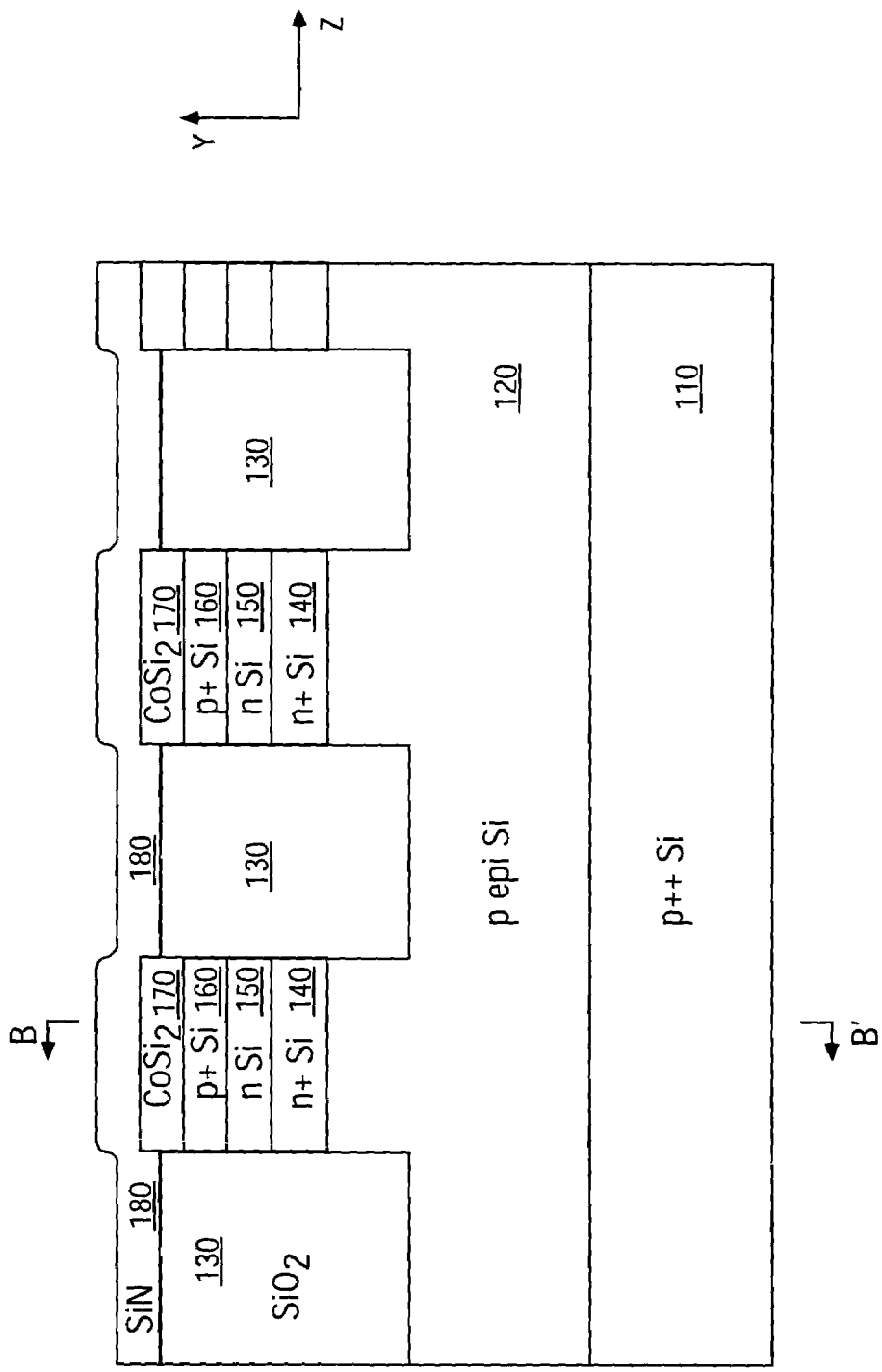
FIG. 4 shows the structure of FIG. 3 after the introduction of a masking material over the structure in accordance with one embodiment of the invention.
Figure 5:
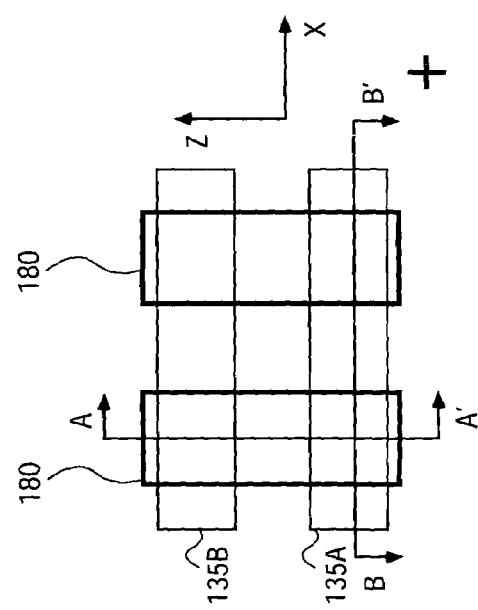
FIG. 5 shows a schematic top view of the structure of FIG. 4.

FIG. 4 shows the structure of FIG. 3 after the introduction of a masking material 180. As will become clear later, masking material 180 serves, in one sense, as an etch stop for a subsequent etch operation. FIG. 5 schematically shows memory cell regions 135A and 135B in an xz plane. Overlying the memory cell is masking material 180. FIG. 6 shows a cross-sectional side view of memory cell region 135A through line B–B' of FIG. 5 in an xy perspective. In one embodiment, a suitable material for masking material 180 is a dielectric material such as silicon nitride ($Si_3N_4$) although other material may be used such as silicon oxynitride ($Si_xO_yN_z$) in both stoichiometric and solid solution ratios.

Figure 7:
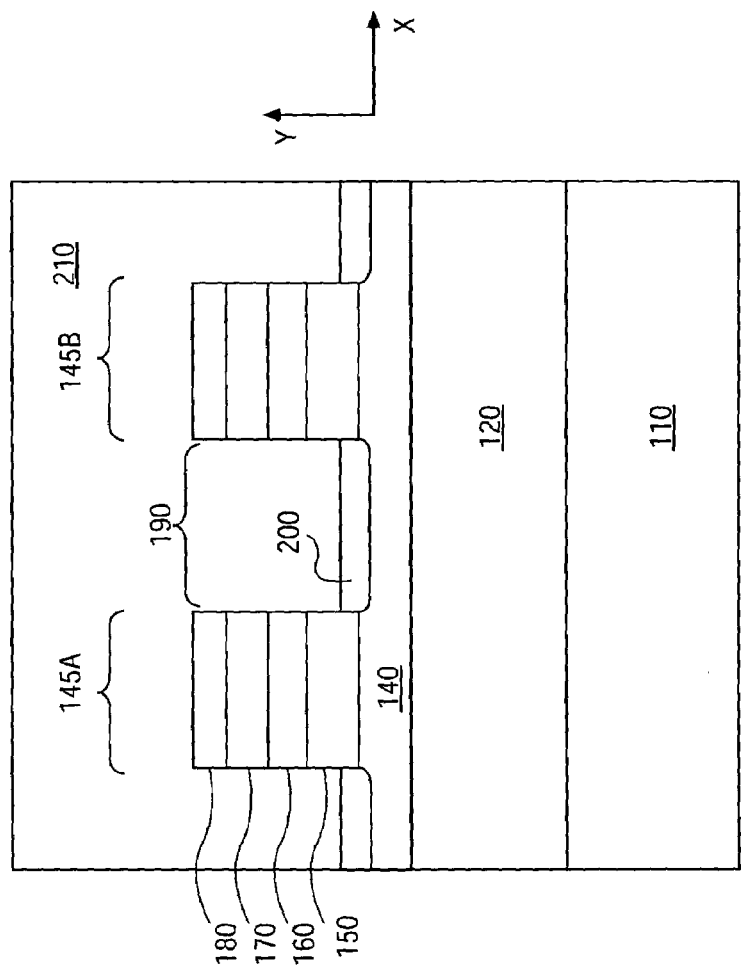
FIG. 7 shows the structure of FIG. 5, through the same cross-sectional view, after the patterning of the x-direction thickness of a memory cell, the introduction of a dopant between the cells, and the introduction of a dielectric material over the structure.

FIG. 7 shows the structure of FIG. 6 from an xy perspective after patterning of the x-direction thickness of the memory cell material to form a trench 190. FIG. 7 shows two memory cells 145A and 145B patterned from memory cell region 135A depicted in FIG. 5. The patterning may be accomplished using conventional techniques for etching, in this example, refractory metal silicide and silicon material to the exclusion of masking material 180. The definition of the x-direction thickness involves, in one embodiment, an etch to conductive material 150 (N-type silicon in this embodiment) of the memory line stack to define memory cells 145A and 145B of memory cell region 135A. In the case of an etch, the etch proceeds through the memory line stack to, in this example, a portion of a conductor or signal line that is in this case conductive material 150. A timed etch may be utilized to stop an etch at this point.

Following the patterning, N-type dopant is introduced at the base of each trench 190 to form pockets 200 having a dopant concentration on the order of about $10^{18}$–$10^{20}$ atoms/cm$^3$ to form an N$^+$ region between memory cells 145A and 145B. Pockets 200 serve, in one sense, to maintain continuity of a row line and to reduce the low resistance. Dielectric material 210 of, for example, silicon dioxide material is then introduced over the structure to a thickness on the order of 100 Å to 50,000 Å.

Figure 8:
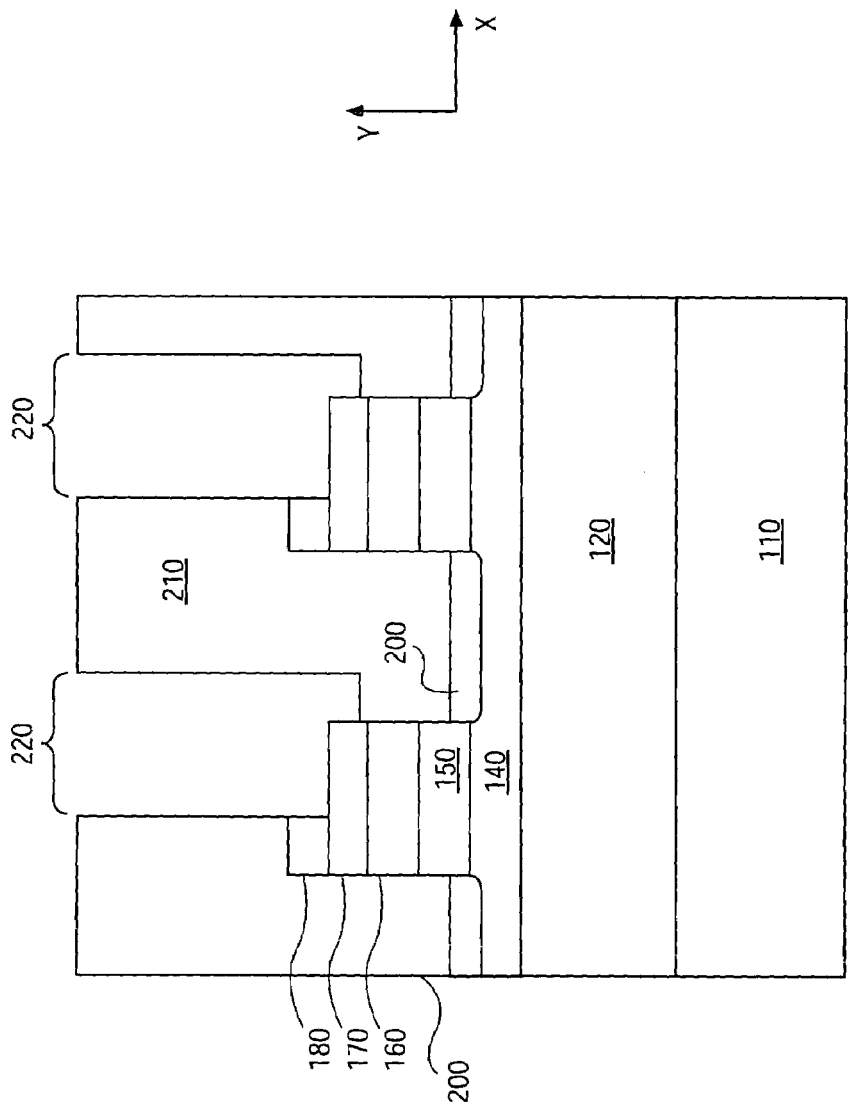
FIG. 8 shows the structure of FIG. 7, through the same cross-sectional view, after the formation of trenches through the dielectric material in accordance with one embodiment of the invention.
Figure 9:
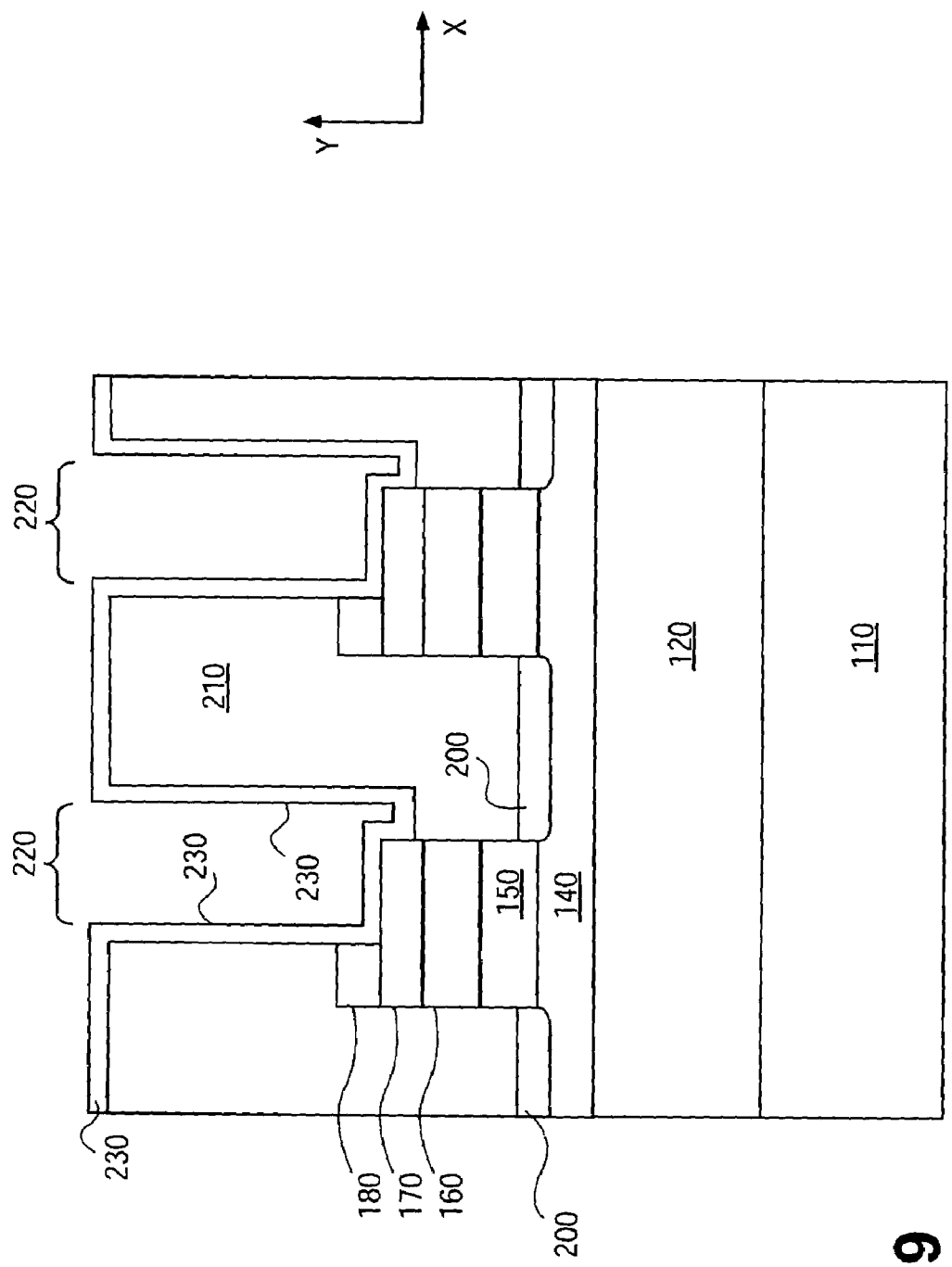
FIG. 9 shows the structure of FIG. 8, through the same cross-sectional view, after the introduction of an electrode material over the structure in accordance with one embodiment of the invention.

FIG. 8 shows the structure of FIG. 7 after the formation of trenches 220 through dielectric materials 210 and masking material 180 to reducer material 170. The formation of trenches 220 may be accomplished using etch patterning with an etchant(s) for etching dielectric materials 210 and 180 and selective to reducer material 170 such that reducer material 170 may serve as an etch stop. As such, dielectric material 210 forms what may be characterized as a container dielectric 210. Trench 220 may be referred to as a recess that is formed in first dielectric 210 to expose at least a portion of the memory cell stack as illustrated in FIG. 9. Although the recess is referred to as trench 220, the type of recess may be selected from a substantially circular recess, a rectangular (square) recess, and a trench recess.

FIG. 9 illustrates the inventive process of forming a lower electrode in a phase-change memory device. The memory line stack may be referred to as an active area. FIG. 9 shows the structure of FIG. 8 after the conformal introduction of a lower electrode material 230 that may be referred to as a metal compound film or alternatively as a polysilicon film.

The material of lower electrode material 230 is preferably a high resistivity metal compound such as a metal nitride, a refractory metal nitride, a metal silicon nitride, a refractory metal silicon nitride, a metal silicide, and a refractory metal silicide. In one example, lower electrode material 230 is a refractory metal nitride compound such as tantalum nitride ($Ta_xN_y$) that, depending upon the desired resistivity, may be provided in either stoichiometric or other metal compound film solid solution ratios.

The introduction is conformal in the sense that lower electrode material 230 is introduced along the side walls and base of trench 220 such that lower electrode material 230 is in contact with reducer material. Lower electrode material 230 includes a metal and at least one of nitrogen or silicon. A given blend of metal compound may be accomplished by chemical vapor deposition (CVD) of at least one constituent of nitrogen and silicon in connection with the metal. Preferably, the composition of lower electrode material 230 is controlled by feed stream amounts to a CVD tool. Depending upon the specific embodiment, other CVD techniques may be used such as plasma enhanced CVD (PECVD).

In another embodiment, the formation of lower electrode material 230 is carried about by physical vapor deposition (PVD) and a target is selected that has a preferred composition for the final metal compound film. Alternatively, a plurality of targets may be combined to achieve a preferred metal compound film composition. In either PVD or CVD, coverage as defined as the ratio of wall deposited thickness to top-deposited thickness, is in a range from about 0.25 to about 1, and preferably above 0.5. In the present invention, CVD formation of lower electrode is preferred. Where lower electrode 230 is a high resistivity metal compound film, the metal compound may also be a refractory metal compound film tantalum nitride, titanium nitride, tungsten nitride, tantalum silicon nitride, titanium silicon nitride, and tungsten silicon nitride. The metal compound, where it is a metal nitride, may have the formula $M_xN_y$, wherein x and y are configured for both stoichiometric and solid solution ratios. The metal compound, where it is a metal silicon nitride, may have the formula $M_xSi_zN_y$, wherein x, z, and y are configured for both stoichiometric and solid solution ratios. Where lower electrode 230 is a polysilicon film, it may be doped in situ during formation thereof, or it may be doped subsequent to formation thereof. In any event, doping is carried out to an extent that allows for Joule resistive heating therein sufficient to achieve a melt temperature of the phase change memory material.

Where a metal nitride is selected for lower electrode material 230, the metal may be selected from Ti and Zr and the like. It may also be selected from Ta and Nb and the like. It may also be selected from W and Mo and the like. It may also be selected from Ni and Co and the like. The metal nitride is preferably a refractory metal nitride compound of the formula $M_xN_y$. The ratio of M:N is in a range from about 0.5:1 to about 5:1, preferably from about 0.6:1 to about 2:1, and most preferably about 1:1. For example, one embodiment of the present invention is a $Ta_xN_y$ compound in the ratio from about 0.5:1 to about 5:1, preferably from about 0.6:1 to about 2:1, and most preferably about 1:1. Another example of an embodiment is a $W_xN_y$ compound in the ratio from about 0.5:1 to about 5:1, preferably from about 0.6:1 to about 2:1, and most preferably about 1:1.

In another embodiment of the invention, lower electrode material 230 may be a metal silicon nitride compound. The metals may be selected from the metal may be selected from Ti and Zr and the like. It may also be selected from Ta and Nb and the like. It may also be selected from W and Mo and the like. It may also be selected from Ni and Co and the like. The metal silicon nitride compound may have the formula $M_xSi_zN_y$, and wherein the ratio of M:Si:N is in a range from about 1:0.5:0.5 to about 5:1:1. Preferably, the ratio is in a range from about 1:1:0.5 to 1:0.5:1, and most preferably about 1:1:1. In one embodiment, a lower electrode material compound is $Ti_xSi_yN_z$ in a ratio from about 1:0.5:0.5 to about 5:1:1, preferably from about 1:1:0.5 to 1:0.5:1, and most preferably about 1:1:1.

In another embodiment, the lower electrode may be a metal silicide compound. The metals may be selected from the metal may be selected from Ti and Zr and the like. It may also be selected from Ta and Nb and the like. It may also be selected from W and Mo and the like. It may also be selected from Ni and Co and the like. The metal silicide compound may have the formula $M_xSi_z$, wherein the ratio of M:Si: is in a range from about 0.5:1 to about 5:1. In one embodiment, a lower electrode material compound is $Ti_xSi_y$ in a ratio from about 0.5:1 to about 5:1, preferably from about 0.6:1 to about 2:1, and most preferably about 1:1. In another embodiment, a lower electrode material compound is $W_xSi_y$ in a ratio from about 0.5:1 to about 5:1, preferably from about 0.6:1 to about 2:1, and most preferably about 1:1.

Figure 10:
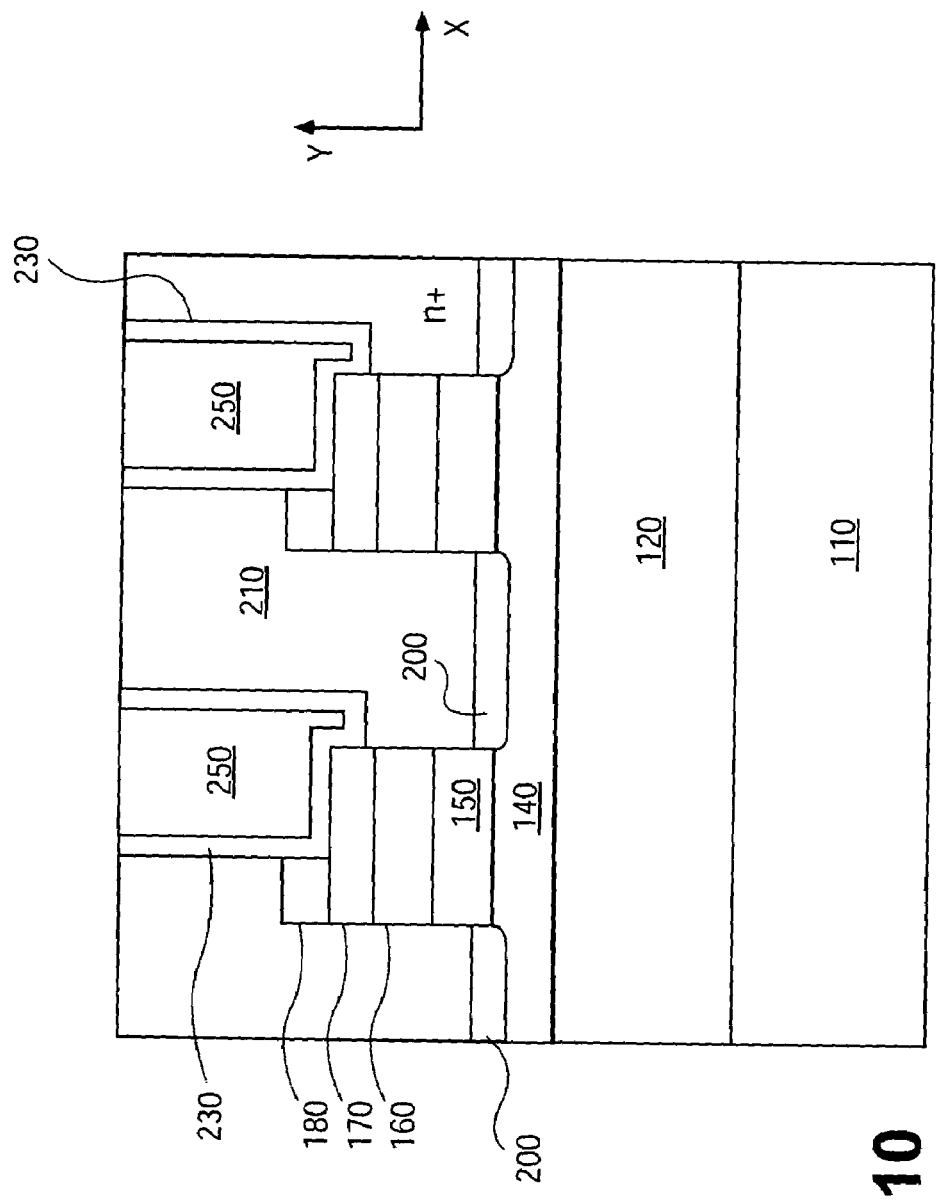
FIG. 10 shows the structure of FIG. 9, through the same cross-sectional view, after planarization down to the lower electrode.

FIG. 10 illustrates the structure depicted in FIG. 9 after further processing. A filler dielectric 250 is formed in trench 220 and a planarization process is carried out that establishes a new upper level 252 of semiconductor structure 100. In one non-limiting embodiment, filler dielectric 250 may be formed by chemical vapor deposition of $SiO_2$ by high density plasma (HDP) such as a tetra ethyl ortho silicate (TEOS) process and the like. The planarization process may be accomplished by methods such as chemical mechanical planarization (CMP), mechanical planarization, and the like. Removal of material may be accomplished by methods such as isotropic etchback, anisotropic etchback, and the like. In one etchback embodiment, a plasma etch is carried out under etchback conditions that are known.

Figure 11:
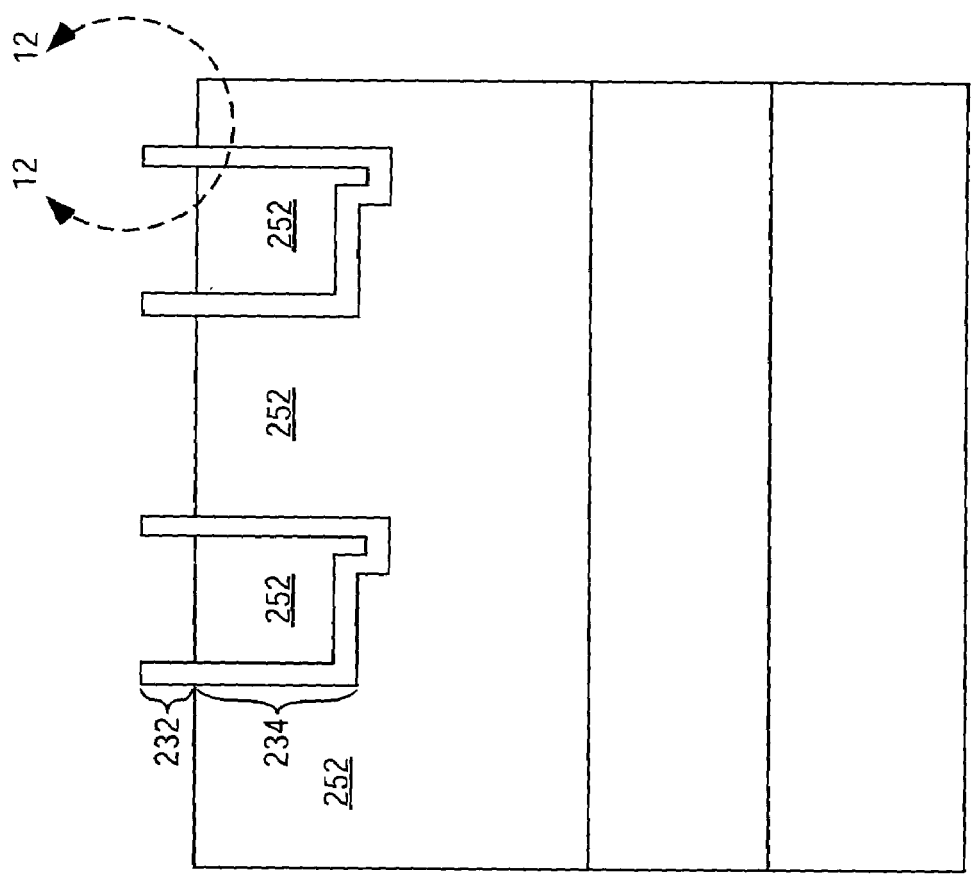
FIG. 11 shows the structure of FIG. 10, through the same cross-sectional view, after an etch back to form a prominence of an upper section of the lower electrode.

Dielectric material 210 and filler dielectric 250, for purposes of this section of the process, may hereinafter be characterized as a first dielectric film. FIG. 11 illustrates removal of a portion of the first dielectric film (dielectric material 210 and filler dielectric 250). Removal of material may be accomplished by methods such as isotropic etchback, anisotropic etchback, and the like. After etch back, lower electrode 230 may be characterized as an upper section 232 and a lower section 234. Upper section may be characterized as a prominence.

Figure 12A:
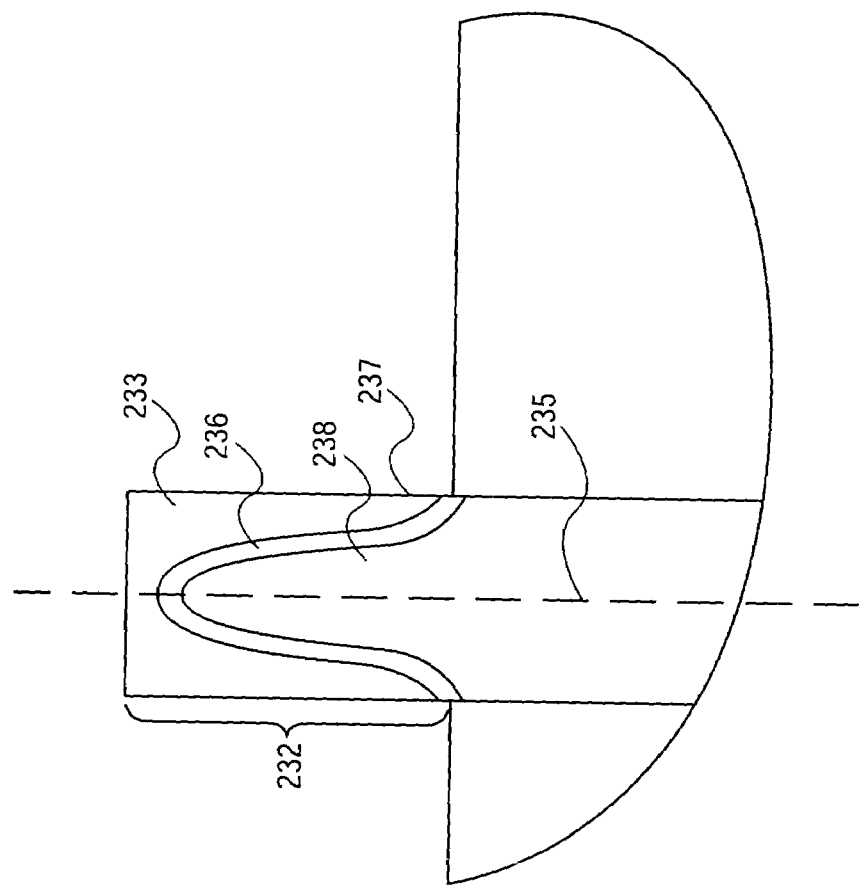
FIG. 12a shows a detail section taken from FIG. 11 to illustrate structure with increased resistivity in the upper section.

FIG. 12a is a detail section taken along the section line 12—12 from FIG. 11 that illustrates further processing. Resistivity in upper section 232 is increased according to the present invention. Resistivity may be increased by a number of processes and equivalents. In one process, a thermal treatment is carried out in the presence of a substance that will have an effect of causing upper section 232 to be more resistive. In one embodiment, a thermal treatment may be carried out in an oxidizing atmosphere. Where upper section 232 is a metal compound film or a refractory metal compound film such as tantalum nitride, upper section 232 may form a husk 233 of substantially dielectric tantalum oxynitiride. Husk 233 is therefore substantially non-conducting. Additionally, beneath husk 233 there may be a transition section 236 wherein upper section 232 is transitioning from a substantially unoxidized core 238. The composition gradient may be observed by beginning at a symmetry line 235 of upper section 232, and moving laterally toward a lateral surface 237. The composition gradient may also be observed in reverse order by taking look at lateral surface 237 of upper section 232 and tending toward symmetry line 235 thereof.

Figure 12B:
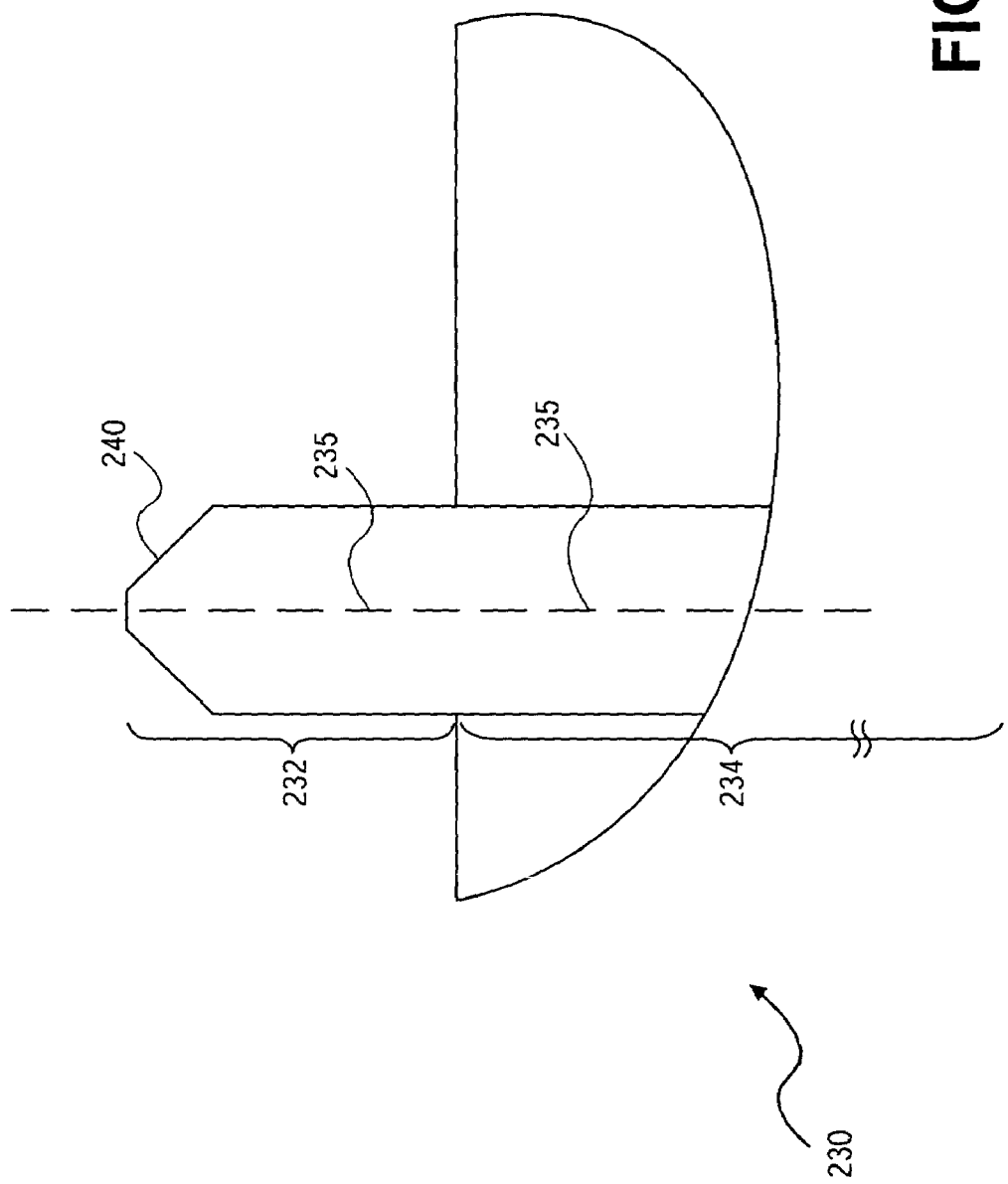
FIG. 12b shows an alternative embodiment of an increased resistivity structure.

Another method of increasing resistivity of upper section 232 is to conduct an etch thereof. The etch may be an isotropic etch wherein material removal at corner surfaces is faster than on flat surfaces, or the etch may be a facet etch thereof. FIG. 12b illustrates upper section 232 after a facet etch although an isotropic etch will accomplish a pointed profile that is characteristic of isotropic etching of a prominence. An isotropic etch profile for the purposes of this disclosure may be referred to as a faceted configuration. By either etch technique, although compositional resistivity is not changed if lower electrode 230 is not compositionally altered, the lineal resistivity is increased at the facet tip 240. In other words, although lower electrode 230 may not be compositionally altered, because the same current that flows through lower section 234 must also flow through upper section 232 at facet tip 240, Joule heating through facet tip 240 will be greater because of its facet configuration. Similarly, referring back to FIG. 12a, Joule heating in unoxidized core 238 is increased.

FIG. 12c illustrates upper section 232 after a deposition of a high resistivity film 244. In one embodiment, high resistivity film 244 is a chemical vapor deposition (CVD) of tantalum nitride ($Ta_xN_y$) that may be provided in both stoichiometric and solid solution ratios. In one embodiment, high resistivity film 244 is a chemical vapor deposition (CVD) of titanium silicon nitride ($Ti_xSi_zN_y$) that may be provided in both stoichiometric and solid solution ratios. Following the formation of high resistivity film 244, a thermal process may be carried out such as thermal oxidation of high resistivity film 244. Where thermal oxidation is carried out, oxygen may diffuse into high resistivity film 244 in contrast to an oxide-metal interface that may occur in the embodiment depicted in FIG. 12a. In some applications, an increased resistivity that results from a compositional change depicted in FIG. 12c may be preferred over purely geometry effects.

Figure 13:
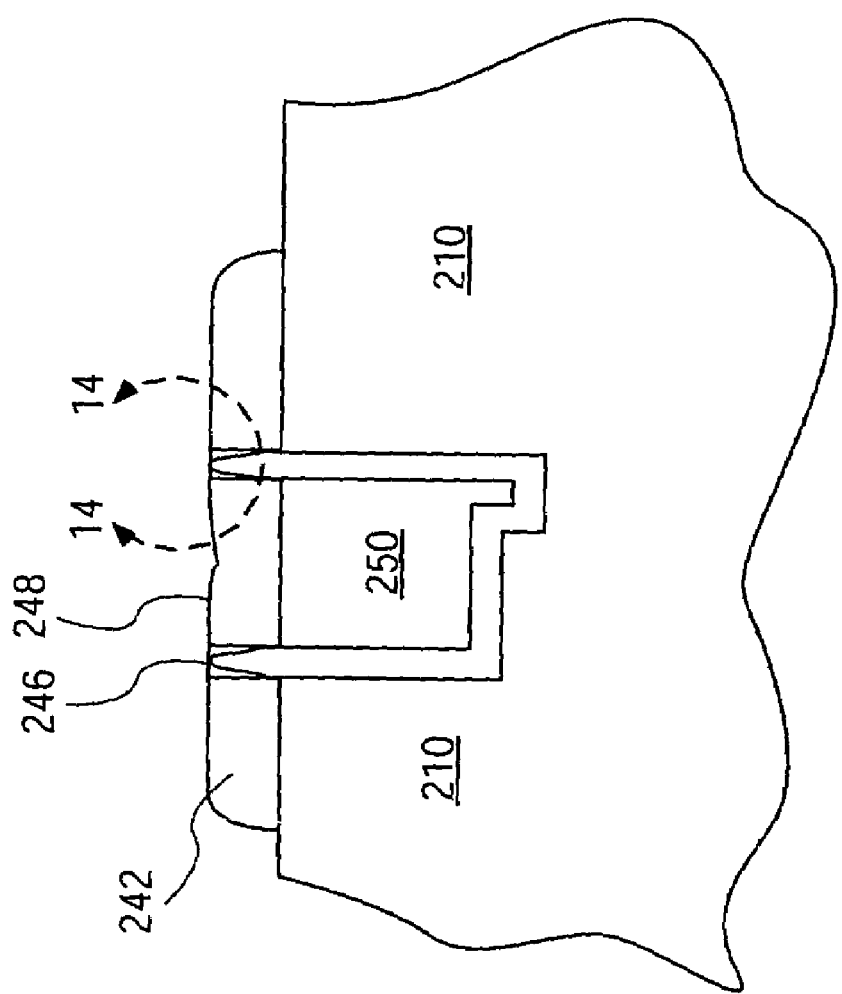
FIG. 13 shows one embodiment of forming a second dielectric film over the upper section.

FIG. 13 illustrates the structure depicted in FIGS. 11 and 12 after further processing. Following increasing resistivity, a second dielectric film 242 is formed over upper section 232. Thereafter, a portion of second dielectric film 242 is removed to expose an upper surface 246 of upper section 232. Preferably, upper surface 246 is substantially coplanar with the second dielectric film upper surface 248. By substantially coplanar, it is preferably meant that at least an area on second dielectric film upper surface 248 adjacent thereto is about as wide as upper section upper surface 232.

Figure 14:
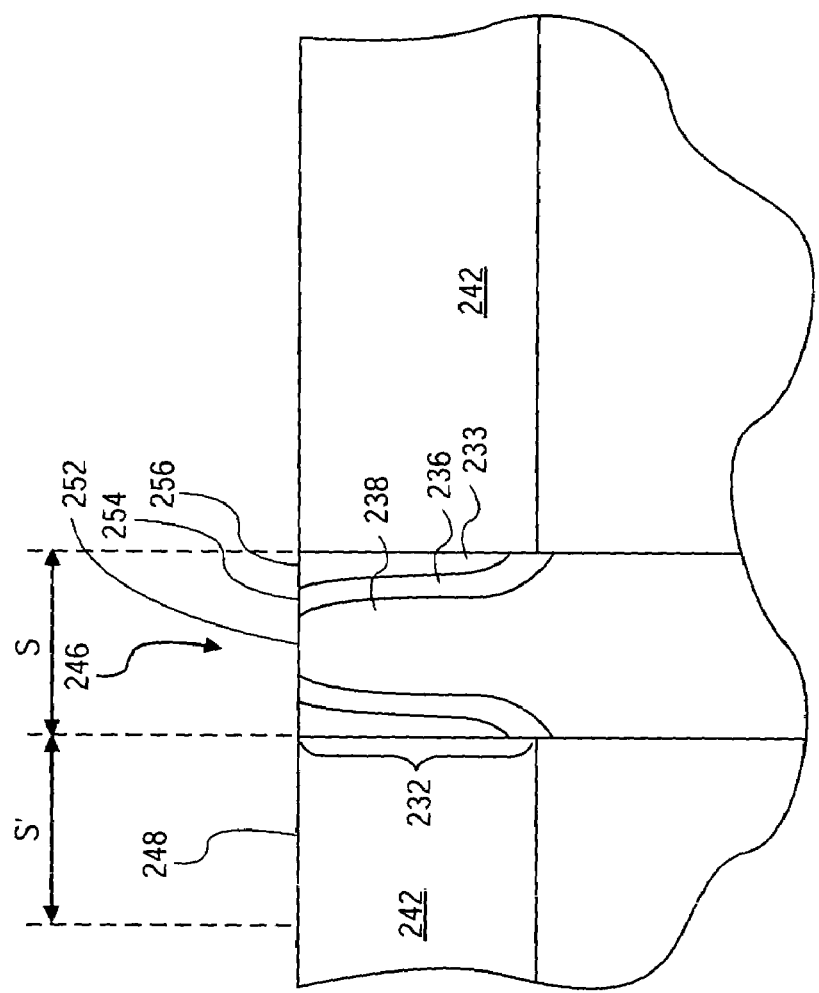
FIG. 14 depicts further processing to expose an upper surface in the lower electrode upper section.

FIG. 14 illustrates second dielectric film upper surface 248 and the substantially coplanar upper surface 246 of upper section 232 in greater detail. In FIG. 14, a distance, S, is depicted as defining the width of upper section 232 as it is exposed through second dielectric film 242. Substantially coplanar thereto is about at least the same distance S' across second dielectric film upper surface 248. Distance S' may be smaller or larger than distance S. Where it is smaller, distance S' may be smaller than distance S in a range from about 10% to about 100%, and alternatively from about 30% to about 80%.

In order to achieve both upper surface 246 of upper section 232 and second dielectric film upper surface 248, a planarization process is carried out. Preferably, a spacer etch is carried out on second dielectric film 242. More preferably, the spacer etch will remove substantially completely oxidized material in upper section 232 to form an exposed lower electrode core 252, an exposed lower electrode transition section 254 if present, and an exposed lower electrode dielectric husk 256 if present. Optionally, the spacer etch may be incorporated into a pre-clean process prior to introduction of the volume of memory material. Such a pre-clean of upper section 232 may be a combination of a wet etch and a sputter etch.

In another embodiment, instead of patterning a spacer precursor over upper section 232, a blanket second dielectric film 242 is formed over substrate 100. CMP may be carried out to remove a portion of second dielectric film 242, however, as with a spacer etch with a spacer precursor, a plasma etch is preferred. In either embodiment, spacer etching conditions are well known in the art and may be selected depending upon desired selectivities in relation to specific structure sizes and compositions of second dielectric film 242.

Figure 15:
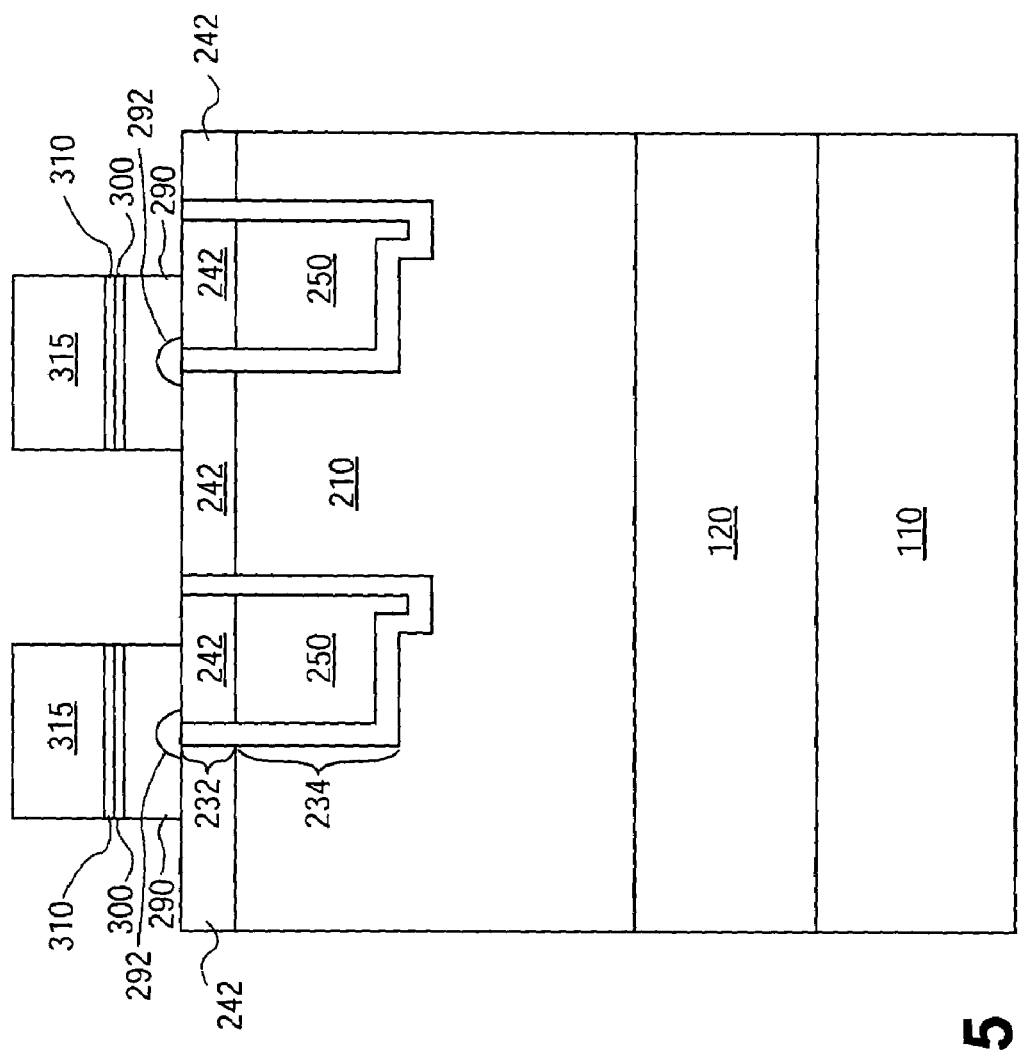
FIG. 15 shows the structure of FIG. 14, through the same cross-sectional view, after the introduction of a volume of memory material and second conductors over the structure, in accordance with one embodiment of the invention.

FIG. 15 shows the structure of FIG. 14 after the introduction of a volume of memory material 290 (represented as memory element 30 in FIG. 1). In one example, memory material 290 is a phase change material. In a more specific example, memory material 290 includes a chalcogenide element(s). Examples of phase change memory material 290 include, but are not limited to, compositions of the class of tellerium-germanium-antimony ($Te_xGe_ySb_z$) material in both stoichiometric and solid-solution ratios. The volume of memory material 290, in one example according to current technology, is introduced and patterned with a thickness on the order of about 600 Å. It can be seen that within memory material 290, a smaller section of memory material 292, also referred to as the mushroom 292 is the portion that is set and reset principally by exposed lower electrode core 252. The dimension of mushroom 292 may be smaller than dimensions achieved in the prior art but there remains no conductive shunt of set chalcogenide material when the volume of memory material is in the re-set phase. Because the actual dimension of the upper section at the interface with the phase-change material is reduced, the amount of the volume of memory material 290 is reduced that must be set and reset. Further, because of the smaller amount that must be set and reset, a lower energy draw is required which will prolong use when a system that uses the invention is in a battery-operated configuration. Additionally, because of the modified resistivity in the tip of upper section 232 a more efficient Joule heating occurs in the lower electrode.

Figure 16:
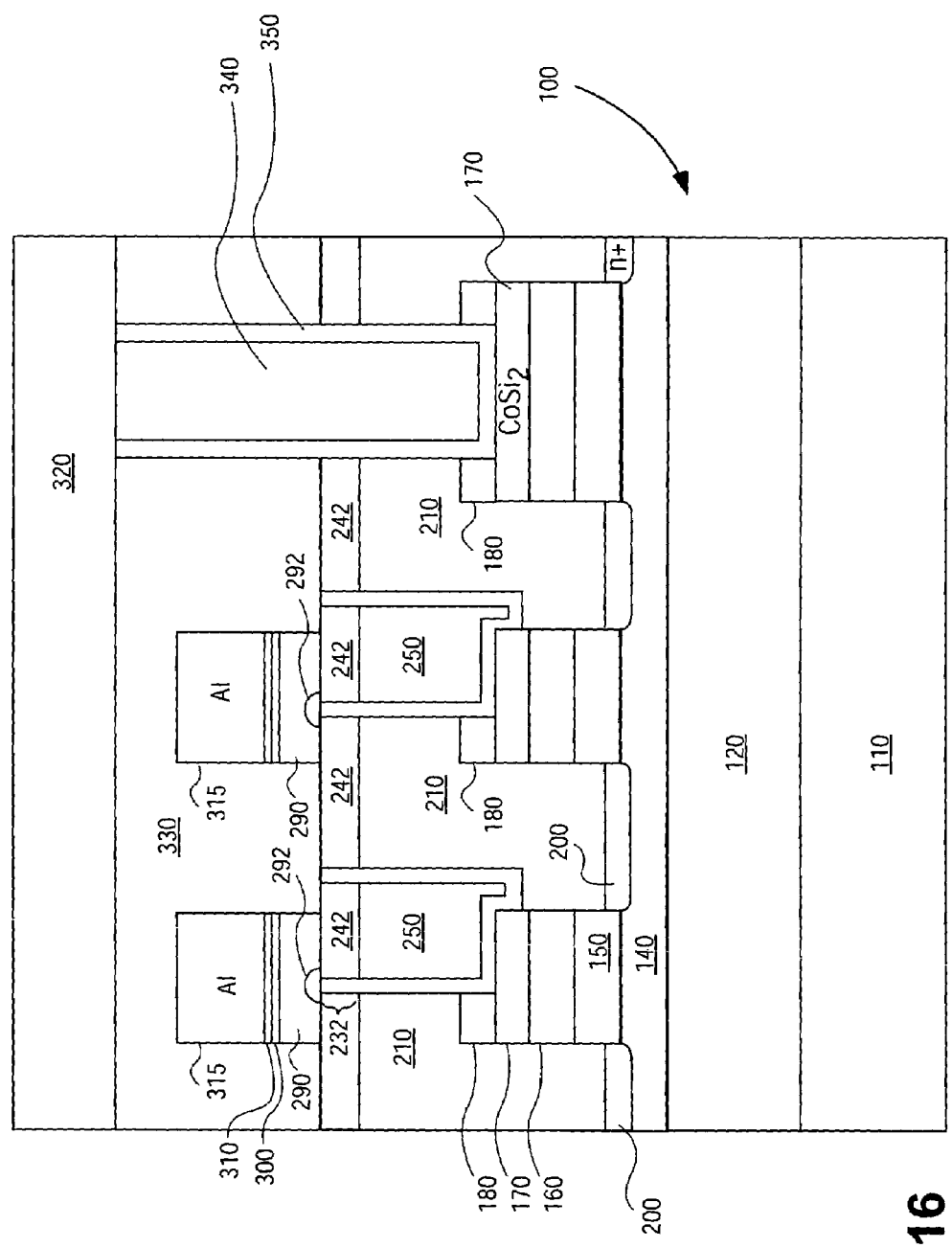
FIG. 16 shows the structure of FIG. 15, through the same cross-sectional view, after the introduction of the dielectric material over the second conductor and a third conductor coupled to the first conductor in accordance with an embodiment of the invention.

Overlying the volume of memory material 290 in the structure of FIG. 16 are barrier materials 300 and 310 of, for example, titanium (Ti) and titanium nitride (TiN), respectively. Barrier material serves, in one aspect, to inhibit diffusion between the volume of memory material 290 and second conductor or signal line material overlying the volume of memory material 290 (e.g., second electrode 10). Overlying barrier materials 300 and 310 is second conductor or signal line material 315. In this example, second conductor or signal line material 315 serves as an address line, a column line (e.g., column line 10 of FIG. 1). Second conductor or signal line material 315 is patterned to be, in one embodiment, generally orthogonal to first conductor or signal line material 140 (column lines are orthogonal to row lines). Second conductor or signal line material 315 is, for example, an aluminum material, such as an aluminum alloy. Methods for the introduction and patterning of the barrier materials and second conductor or signal line material 315 include such techniques as known to those of skill in the art.

FIG. 16 shows the structure of FIG. 15 also after the introduction of dielectric material 330 over second conductor or signal line material 315. Dielectric material 330 is, for example, $SiO_2$ or other suitable material that surrounds second conductor or signal line material 315 and memory material 290 to electronically isolate such structure. Following introduction, dielectric material 330 is planarized and a via is formed in a portion of the structure through dielectric material 330, dielectric material 210, and masking material 180 to reducer material 170. The via is filled with conductive material 340 such as tungsten (W) and barrier material 350 such as a combination of titanium (Ti) and titanium nitride (TiN). Techniques for introducing dielectric material 330, forming and filling conductive vias, and planarizing are known to those skilled in the art.

The structure shown in FIG. 16 also shows additional conductor or signal line material 320 introduced and patterned to mirror that of first conductor or signal line material 140 (e.g., row line) formed on substrate 100. Mirror conductor line material 320 mirrors first conductor or signal line material 140 and is coupled to first conductor or signal line material 140 through a conductive via. By mirroring a doped semiconductor such as N-type silicon, mirror conductor line material 320 serves, in one aspect, to reduce the resistance of conductor or signal line material 140 in a memory array, such as memory array 5 illustrated in FIG. 1. A suitable material for mirror conductor line material 320 includes an aluminum material, such as aluminum or an aluminum alloy.

In the above description of forming a memory element such as memory element 15 in FIG. 1, metal compound film 230 is an electrode and is described between a memory material and conductors or signal lines (e.g., row lines and column lines) that has improved electrical characteristics. In the embodiment described, the resistivity of the electrode is selected to make a given metal compound film 230 as set forth herein. In this manner, a supplied voltage from second conductor or signal line material 320 or first conductor or signal line material 140 to the memory material 290 may be near the volume of memory material 290 and dissipation of energy to cause a phase change may be minimized. The discussion detailed the formation of one memory element of memory array 5. Other memory elements of memory array 5 may be fabricated in the same manner. It is to be appreciated that many, and possibly all, memory elements of memory array 5, along with other integrated circuit circuitry, may be fabricated simultaneously.

Figure 17:
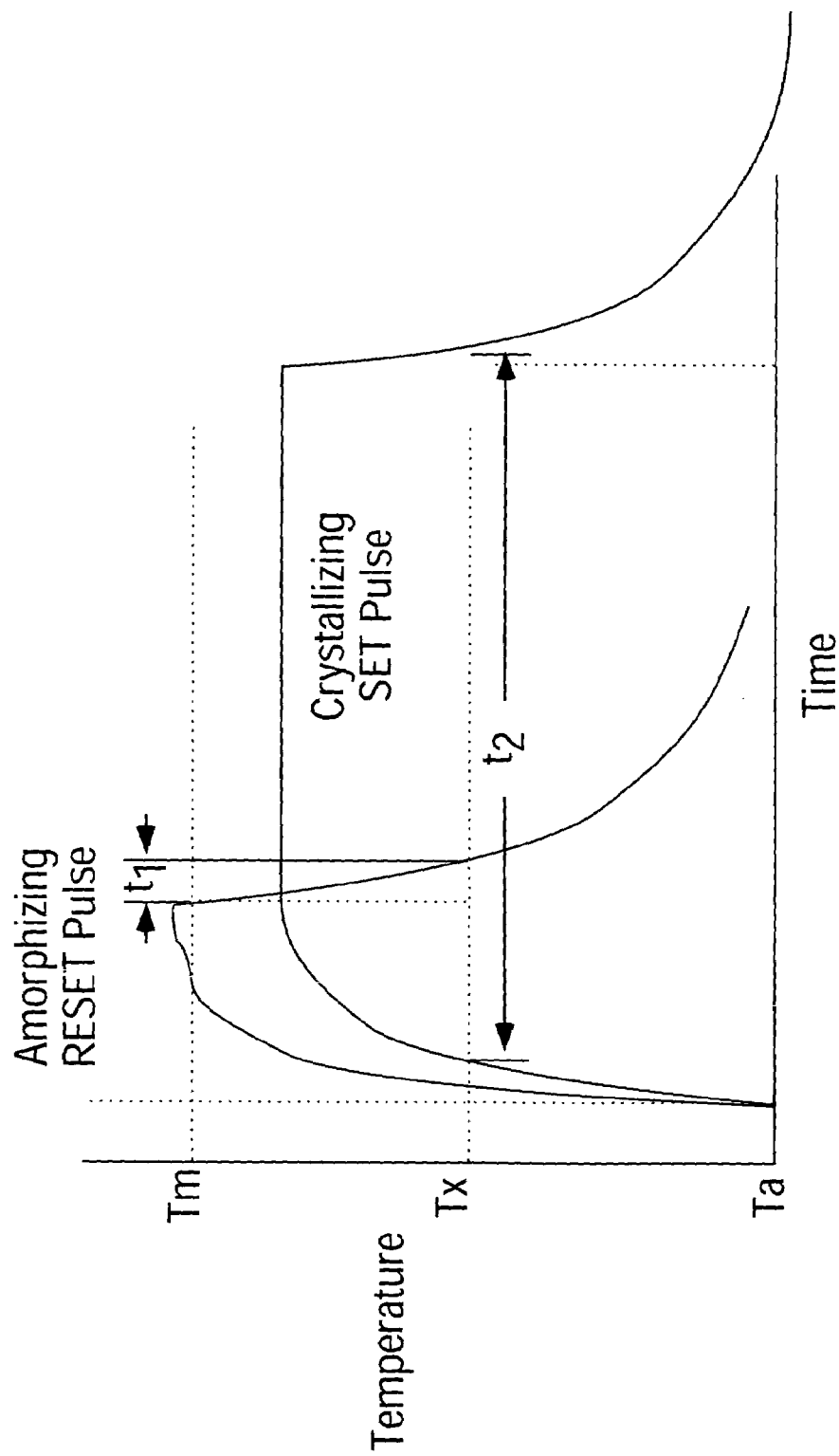
FIG. 17 shows a graphical representation of setting and resetting a volume of a phase change memory material in terms of temperature and time.

FIG. 17 presents a graphical representation of the setting and resetting of a volume of phase change memory material. Referring to FIG. 1, setting and resetting memory element 15 (addressed by column line 10a and row line 20a) involves, in one example, supplying a voltage to column line 10a to introduce a current into the volume of memory material 30 as illustrated in FIG. 1 or memory material 290 as illustrated in FIG. 12. The current causes a temperature increase at the volume of memory material 30. Referring to FIG. 13, to amorphize a volume of memory material, the volume of memory material is heated to a temperature beyond the amorphisizing temperature, $T_M$. Once a temperature beyond $T_M$ is reached, the volume of memory material is quenched or cooled rapidly (by removing the current flow). The quenching is accomplished at a rate, $t_1$ that is faster than the rate at which the volume of memory material 30 can crystallize so that the volume of memory material 30 retains its amorphous state. To crystallize a volume of memory material 30, the temperature is raised by current flow to the crystallization temperature for the material and retained at that temperature for a sufficient time to crystallize the material. After such time, the volume of memory material is quenched (by removing the current flow).

In each of these examples of resetting and setting a volume of memory material 30, the importance of concentrating the temperature delivery at the volume of memory material 30 is illustrated. One way this is accomplished is modifying a portion of the electrode as described above. The inset of FIG. 17 shows memory cell 15 having an electrode with modified portion 35 (illustrated as a resistor) to concentrate heat (current) at the volume of memory material 30.

In the preceding example, the volume of memory material 30 was heated to a high temperature to amorphize the material and reset the memory element (e.g., program 0). Heating the volume of memory material to a lower crystallization temperature crystallizes the material and sets the memory element (e.g., program 1). It is to be appreciated that the association of reset and set with amorphous and crystalline material, respectively, is a convention and that at least an opposite convention may be adopted. It is also to be appreciated from this example that the volume of memory material 30 need not be partially set or reset by varying the current flow and duration through the volume of memory material.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A phase-change memory cell comprising:
   phase-change memory cell substrate including a lower electrode in a first dielectric film, wherein the lower electrode comprises an upper section and a lower section;
   wherein the upper section forms a prominence that extends above the first dielectric film; and
   wherein the upper section has a greater resistivity than the lower section.

2. The phase-change memory cell according to claim 1, further comprising:
   a second dielectric film disposed against the upper section, wherein the second dielectric film to exposes an upper surface of the upper section.

3. The phase-change memory cell according to claim 1, further comprising:
   a second dielectric film disposed against the upper section, wherein the second dielectric film to exposes an upper surface of the upper section, wherein the second dielectric film has a blanket configuration.

4. The phase-change memory cell according to claim 1, wherein the upper section has a dielectric husk disposed thereon.

5. The phase-change memory cell according to claim 1, wherein the upper section forms at least a conductivity gradient taken from a lateral surface of the upper section and tending toward a symmetry line thereof.

6. The phase-change memory cell according to claim 1, wherein the upper section has a faceted configuration.

7. The phase-change memory cell according to claim 1, wherein the lower electrode further comprises:
   forming a metal compound film disposed in a recess.

8. The phase-change memory cell according to claim 1, wherein the lower electrode further comprises:
   a refractory metal compound film disposed in a recess.

9. The phase-change memory cell according to claim 1, wherein the lower electrode further comprises:
   a refractory metal compound film in a recess, wherein the refractory metal compound film is selected from tantalum nitride, titanium nitride, tungsten nitride, tantalum silicon nitride, titanium silicon nitride, and tungsten silicon nitride.

10. The phase-change memory cell according to claim 1, wherein the lower electrode further comprises:
    a polysilicon film disposed in a recess.

11. The phase-change memory cell according to claim 1, further comprising:
    a phase-change material disposed over the upper section.

12. An apparatus comprising:
    a dedicated memory chip including a plurality of first address lines and a plurality of second address lines, a plurality of programmable elements electrically coupled to respective ones of the plurality of first address lines and the plurality of second address lines and a plurality of electrodes respective ones of which are coupled between respective ones of the plurality of programmable elements and respective ones of one of the plurality of first address lines and the plurality of second address lines, each of the plurality of electrodes comprising an upper section and a lower section, and addressing circuitry coupled to the plurality of first address lines and second address lines,
    wherein the upper section of each of the plurality of electrodes forms a prominence that extends above a first dielectric film, and
    wherein the upper section of each of the plurality of electrodes has a greater resistivity than the lower section.

13. The apparatus according to claim 12, wherein the first dielectric film is disposed against the lower section of each of the plurality of electrodes and the dedicated memory chip further including a second dielectric film disposed against the upper section of each of the plurality of electrodes.

14. The apparatus according to claim 12, wherein each of the plurality of electrodes further comprises a conductive material with the upper section having a dielectric husk disposed thereon.

15. The apparatus according to claim 12, wherein the upper section of each of the plurality of electrodes forms at least a conductivity gradient taken from a lateral surface of the upper section and tending toward a symmetry line thereof.

16. The apparatus according to claim 12, wherein the upper section of each of the plurality of electrodes has a faceted configuration.

17. The apparatus according to claim 12, wherein each of the plurality of electrodes further comprises a material selected from a group consisting of a tantalum nitride, titanium nitride, tungsten nitride, tantalum silicon nitride, titanium silicon nitride, and tungsten silicon nitride.

18. The apparatus according to claim 12, wherein each of the plurality of electrodes comprises polycrystalline silicon.

* * * * *